March 1, 1955 O. B. DUTTON 2,703,387
FREQUENCY MODULATION
Filed Nov. 7, 1950 2 Sheets-Sheet 1

INVENTOR
Oscar B. Dutton
BY
Charles H. Brown
ATTORNEY

March 1, 1955 O. B. DUTTON 2,703,387

FREQUENCY MODULATION

Filed Nov. 7, 1950 2 Sheets-Sheet 2

INVENTOR

Oscar B. Dutton

BY

Charles H. Brown

ATTORNEY

United States Patent Office 2,703,387 Patented Mar. 1, 1955

2,703,387

FREQUENCY MODULATION

Oscar B. Dutton, Redondo Beach, Calif., assignor to Radio Corporation of America, a corporation of Delaware Application November 7, 1950, Serial No. 194,469

The terminal 15 years of the term of the patent has been disclaimed

2 Claims. (Cl. 332—26)

This invention relates to frequency modulation, and more particularly to circuits for varying the frequency of an oscillator in accordance with a control voltage or other signal.

An object of this invention is to devise novel circuits by means of which a stable oscillator, such as a crystal-controlled oscillator, can be rapidly modulated in frequency.

Another object is to provide novel circuits by means of which a crystal oscillator may be electronically frequency modulated with a large frequency deviation.

A further object is to enable the frequency of a crystal oscillator to be electronically modulated with a somewhat larger frequency deviation than has heretofore been possible.

The foregoing and other objects of the invention will be best understood from the following description of some exemplifications thereof, reference being had to the accompanying drawings, wherein.

Briefly, the objects of this invention are accomplished in the following manner: An inductance-capacitance (LC) parallel resonant circuit is connected in effect across the terminals of a crystal which in turn is connected between the grid and cathode of a tube which is connected to act as an oscillator. A reactance tube, controllable as to its reactive effect by a control or modulating voltage applied to its grid, is connected across the parallel resonant circuit, the high frequency voltage being supplied in proper phase to the reactance tube by means of a coil inductively coupled to the inductance of the LC circuit. By appropriate connections, this reactance tube may be made to provide either an inductive or a capacitive effect. In a modification, two reactance tubes may be utilized, one acting as an inductance simultaneously with the action of the other as a capacitance.

Figure 1:
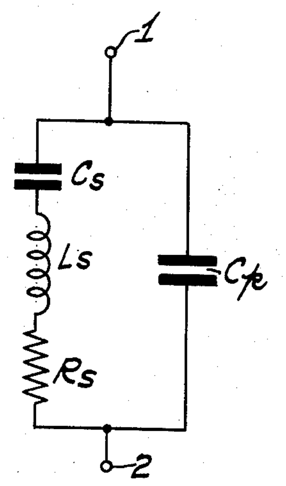
Fig. 1 is an equivalent circuit diagram of a piezoelectric crystal.
Figure 2:
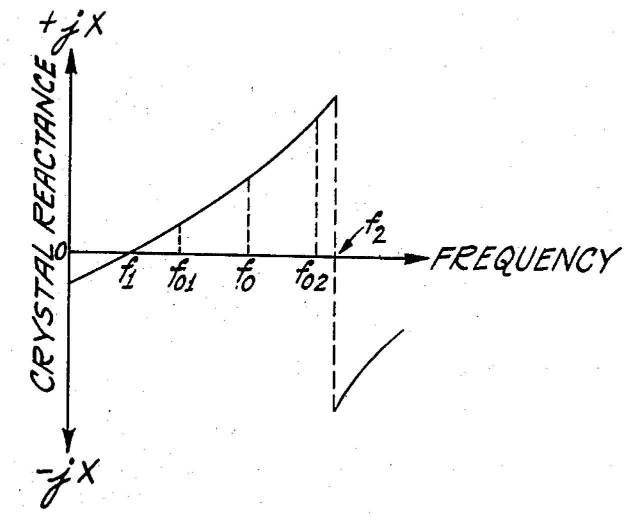
Fig. 2 is a typical crystal reactance vs. frequency characteristic.

Fig. 1 represents the equivalent electrical circuit of a piezoelectric crystal as viewed between its terminals 1 and 2. This circuit is a series combination of capacitance $C_s$, inductance $L_s$ and resistance $R_s$ shunted by a parallel capacitance $C_p$. As viewed from its terminals 1 and 2, its reactance characteristic with increasing frequency is as illustrated in Fig. 2. In Fig. 2, the point $f_1$ is the series resonant frequency of $C_s$ and $L_s$ and the point $f_2$ is the frequency of maximum impedance and is a function of the values of $R_s$ and $C_p$. All this is well-known to those skilled in the art to which this invention relates.

If such a crystal is connected between the grid and cathode of an evacuated electron discharge tube device having at least anode, grid and cathode and having the proper anode load and circuit connections and conditions for oscillation, the frequency of oscillation, $f_0$, will be somewhere between the limiting points $f_1$ and $f_2$, the location of $f_0$ depending upon the added parallel capacitance of the oscillator tube. In other words, if the capacitance of the oscillator tube is at a minimum the frequency of oscillation will be very nearly $f_2$, decreasing with increasing added capacitance to a point slightly above $f_1$. The usual lower limit to such frequency variation is the point at which the added capacitance becomes too great and the crystal refuses to oscillate.

Assume that $f_0$ is the nominal oscillation frequency with $C_p$ at its nominal value and that $f_{01}$ is the lowest frequency consistent with permissible capacity loading of the crystal. Now, if $C_p$ could be effectively reduced, the frequency of oscillation could conceivably be increased to $f_{02}$ and the frequency of the oscillator varied at will between the limits $f_{01}$ and $f_{02}$.

One means of accomplishing this is to place a parallel resonant LC circuit across the crystal terminals. The constants of this circuit could be varied to produce a capacitive reactance equal to the net inductive reactance of the crystal at any predetermined point between $f_{01}$ and $f_{02}$.

Figure 3:
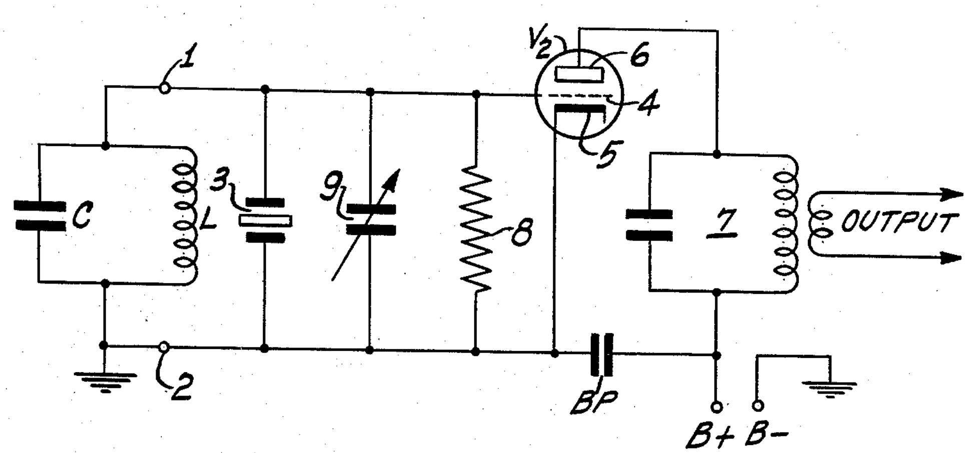
Fig. 3 is a diagrammatic representation of a crystal oscillator of the prior art.

Fig. 3 shows a circuit in accordance with the arrangement just described. A piezoelectric crystal 3 has its upper electrode connected to the grid 4 of a vacuum tube $V_2$, the lower electrode of said crystal being connected to ground and the cathode 5 of said tube. The anode 6 of tube $V_2$ is coupled to a parallel tuned circuit 7 from which the generated oscillations may be supplied to frequency multipliers and/or amplifiers or more directly to utilization means. One side of the source of direct potential is grounded. Resistor 8 between ground and grid 4 supplies direct current potential to the grid 4. Electrode 6 is supplied with appropriate operating potential as shown, the source of supply being shunted by bypassing condenser BP. A slight or vernier adjustment of the frequency of operation of the crystal may be made by adjustment of the condenser 9 connected thereacross.

A parallel circuit LC is connected directly across the crystal terminals 1 and 2. The constants of circuit LC are made such that the resultant reactance of the circuit LC, capacitance 9 and the input capacitance $C_{gk}$ of $V_2$ always looks like a capacitive reactance between the frequency limits $f_{01}$ and $f_{02}$, this resultant reactance being less than the reactance of 9 and $C_{gk}$ of $V_2$ alone. Thus, $C_p$ is effectively reduced, by the action of the net inductive reactance of LC which is in effect in opposition to the net capacitive reactance of 9 plus $C_{gk}$ of $V_2$. Since the crystal 3 will oscillate at a frequency at which its inductive reactance is equal to the net capacitive reactance of the input circuit of $V_2$, the nominal oscillation frequency of the circuit arrangement is increased to $f_{02}$.

Figures 4, 5:
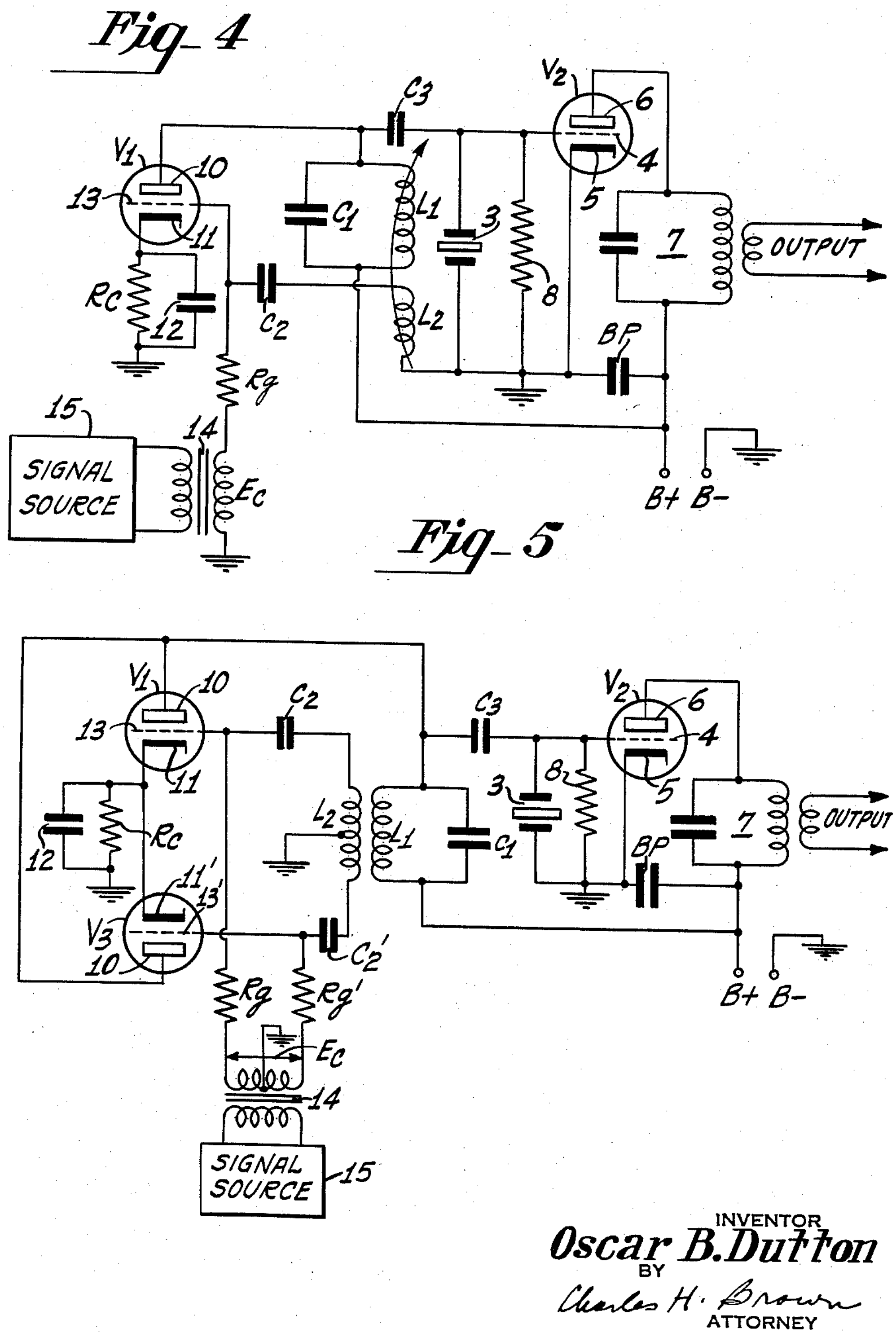
Figs. 4 and 5 are schematic representations of frequency modulated oscillator circuits according to this invention.

According to the present invention, the feature of a parallel LC network across the crystal (as disclosed in Fig. 3) is utilized in a novel circuit arrangement to provide an electronic means for varying the frequency of a crystal oscillator in accordance with a control voltage or other signal. Such a circuit arrangement is illustrated in Fig. 4. In this circuit, the crystal 3 is connected between grid 4 and cathode 5 of oscillator tube $V_2$. The parallel circuit, comprising a capacitive branch $C_1$ and an inductive branch $L_1$, is coupled between one terminal of the crystal 3 and ground through a coupling condenser $C_3$ and condenser BP. The lower electrode of crystal 3 is grounded, as in Fig. 3. The anode 10 of a reactance vacuum tube $V_1$ is connected directly to the upper end of $L_1C_1$, while the cathode 11 of $V_1$ is connected to ground through a biasing arrangement consisting of a resistor $R_c$ shunted by a condenser 12. It will be recalled that the lower end of $L_1C_1$ is grounded through condenser BP; therefore, the anode-cathode path of $V_1$ is in effect connected across circuit $L_1C_1$.

Coil $L_2$ is coupled inductively to inductance coil $L_1$. One end of $L_2$ is grounded and the opposite end is connected through a coupling condenser $C_2$ to grid 13 of tube $V_1$. Thus, a portion of the voltage across $L_1$ is in effect coupled directly to the grid 13 of reactance tube $V_1$. The control grid 13 of tube $V_1$ is modulated by a control or signal voltage $E_c$, which is applied through resistor $R_g$ to grid 13. Voltage $E_c$ appears across the secondary of a transformer 14 the primary of which is supplied by a signal source 15. One end of the secondary of transformer 14 is grounded and the opposite end is connected to the lower end of resistor $R_g$, the upper end of this resistor being connected to grid 13.

If the circuit of Fig. 4 is adjusted, with no voltage at $E_c$, so that the crystal is oscillating at $f_0$ (Fig. 2), the voltage at the grid 13 will lead the voltage at anode 10 by either 90° or 270°, depending on the relative polarities of coils $L_1$ and $L_2$, which are coupled inductively. It will be remembered that circuit $L_1C_1$, like circuit LC in Fig. 3, is not resonant at frequency $f_0$, so provides a reactive (inductive) current at this frequency. The circuit $L_1C_1$ always looks like an inductive reactance between the frequency limits $f_{01}$ and $f_{02}$, as in Fig. 3, the purpose being to reduce the parallel capacitance $C_p$ of the crystal circuit.

First assume that the voltage at grid 13 leads the voltage at anode 10 by 90°. This phase relation could result from the 90° lagging voltage ($L_1C_1$ being inductive) plus 180° phase shift due to the polarity of the $L_1$, $L_2$ connections. Now, if a voltage $E_c$ which is positive with respect to ground is applied, the anode 10 of $V_1$ will draw a current that leads by 90° the anode voltage causing it. This will, in effect, place a capacitive reactance in parallel with circuit $L_1C_1$, lowering the crystal oscillation frequency below $f_0$ to $f_{01}$, Fig. 2. If voltage $E_c$ is removed, the anode 10 will draw less current, increasing the frequency to $f_0$. If voltage $E_c$ now goes negative with respect to ground, $V_1$ will draw no plate current, resulting in a further increase in frequency above $f_0$ to $f_{02}$. Thus, the capacitive reactance tube $V_1$ enables rapid electronic frequency modulation of the crystal oscillator to be accomplished, over a wide frequency range. With this arrangement, a positive voltage $E_c$ causes a decrease in frequency and a negative voltage, an increase in frequency.

If the relative polarities of coils $L_1$ and $L_2$ are reversed, the voltage at grid 13 leads the voltage at anode 10 by 270°. This phase relation could result from the 90° lagging voltage ($L_1C_1$ being inductive) plus zero degrees phase shift due to the polarity of the $L_1$, $L_2$ connections. Now, if a voltage $E_c$ which is positive with respect to ground is applied, the anode 10 of $V_1$ will draw a current that lags by 90° the anode voltage causing it. This will, in effect, place an inductive reactance in parallel with circuit $L_1C_1$, increasing the crystal oscillation frequency above $f_0$ to $f_{02}$, Fig. 2. If voltage $E_c$ is removed, the anode 10 will draw less current, decreasing the frequency to $f_0$. If voltage $E_c$ now goes negative with respect to ground, $V_1$ will draw no plate current, resulting in a further decrease in frequency below $f_0$ to $f_{01}$. Thus, the inductive reactance tube $V_1$ now enables rapid electronic frequency modulation of the crystal oscillator to be accomplished, over a wide frequency range. With this arrangement, a positive voltage at $E_c$ causes an increase in frequency and a negative voltage, a decrease in frequency.

The effects previously described, which cause the reactance tube to act as either inductive or capacitive reactance, may be utilized to provide a so-called differential control of the crystal frequency. Such an arrangement is illustrated in Fig. 5. In Fig. 5, elements the same as those previously described are denoted by the same reference numerals. In Fig. 5, an additional reactance vacuum tube $V_3$ is provided, having cathode 11′, grid 13′ and anode 10′. Anode 10′ is connected directly to anode 10 and the upper side of circuit $L_1C_1$. Cathode 11′ is connected to cathode 11 and thereby also through the biasing arrangement $R_c$, 12 to ground.

Coil $L_2$ is inductively coupled to $L_1$ and is grounded at its midpoint. One end of $L_2$ is coupled through $C_2$ to grid 13 of tube $V_1$ and the opposite end of this coil is coupled through condenser $C_2'$ to grid 13′ of tube $V_3$. Thus, the grids 13 and 13′ are coupled oppositely to the voltage in $L_1$. Tube $V_1$ therefore functions as a capacitive reactance and tube $V_3$ functions as an inductive reactance, both of these reactances being coupled in parallel with $L_1C_1$, in the same way as in Fig. 4.

The secondary of transformer 14 is grounded at its midpoint. One end of this secondary is coupled through $R_g$ to grid 13 of tube $V_1$ and the opposite end of said secondary is coupled through resistor $R_g'$ to grid 13′ of tube $V_3$. Thus, the voltage $E_c$ is applied to the grids 13 and 13′ oppositely or 180° out of phase. In other words, a positive control or modulating voltage is applied to grid 13 simultaneously with the application of a negative control or modulating voltage to grid 13′. Conversely, when the control or modulating voltage applied to grid 13 is negative, the corresponding voltage applied to grid 13′ is positive. Since the oscillator frequency change is in the same direction for a positive voltage applied to grid 13 and a negative voltage applied to grid 13′, and vice versa, at every instant the oscillator frequency changes produced by the two reactance tubes are in the same direction. Thus, the circuit of Fig. 5 will produce greater frequency deviations, for the same control or modulating voltage, than will the circuit of Fig. 4.

The circuits of this invention will operate satisfactorily at any frequency for which quartz crystals may be ground, from 50 kilocycles to 30 megacycles, for example. The frequency deviation obtainable is a function of the type of crystal cut employed, and it is possible to obtain as much as one kilocycle of frequency deviation per megacycle of crystal frequency.

What I claim as my invention is as follows:

1. Apparatus for controlling the frequency of operation of a tube generator of the type wherein the tube has two electrodes coupled by a piezoelectric crystal, comprising a reactive network including an inductance and another impedance directly shunting said crystal, a pair of electron discharge devices each having at least an anode, a grid and a cathode, means coupling the two anodes to the same point of high radio frequency potential on said network, means coupling the two grids to said inductance in such a manner that the radio frequency potentials applied to said two grids are out of phase with each other, means coupling the two cathodes to the same point of low radio frequency potential on said network, each device and its connections being arranged and operated to provide a simulated reactance in shunt to said network, of a value depending on the conductivity of the corresponding device, the reactances provided by the two devices being of opposite sign, and connections for controlling the conductivities of the two devices differentially in accordance with control potentials.

2. Apparatus for controlling the frequency of operation of a tube generator of the type wherein the tube has two electrodes coupled by a piezoelectric crystal, comprising a reactive network including an inductance shunting said crystal, a pair of electron discharge devices each having at least an anode, a grid and a cathode, means coupling the two anodes to the same point of high radio frequency potential on said network, means coupling the two grids to said inductance in such a manner that the radio frequency potentials applied to said two grids are out of phase with each other, said last-mentioned means including a coil inductively coupled to such inductance, means connecting the midpoint of said coil to a point of fixed potential, and means connecting the opposite ends of said coil one to each of said grids, means coupling the two cathodes to the same point of low radio frequency potential on said network, each device and its connections being arranged and operated to provide a simulated reactance in shunt to said network, of a value depending on the conductivity of the corresponding device, the reactances provided by the two devices being of opposite sign, and connections for controlling the conductivities of the two devices differentially in accordance with control potentials.

References Cited in the file of this patent

UNITED STATES PATENTS

| | | |
|---|---|---|
| 1,472,583 | Cady | Oct. 30, 1923 |
| 2,018,318 | Purington | Oct. 22, 1935 |
| 2,043,242 | Gebhard | June 9, 1936 |
| 2,298,436 | Usselman | Oct. 13, 1942 |
| 2,316,927 | Winlund | Apr. 10, 1943 |
| 2,382,198 | Bollinger | Aug. 14, 1945 |
| 2,424,246 | Mason | July 20, 1947 |
| 2,438,392 | Gerber | Mar. 23, 1948 |